(12) United States Patent
Fujisawa et al.

(10) Patent No.: US 6,380,602 B1
(45) Date of Patent: Apr. 30, 2002

(54) SEMICONDUCTOR DEVICE

(75) Inventors: Tomotaka Fujisawa, Tokyo; Chihiro Arai, Kanagawa, both of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/557,689

(22) Filed: Apr. 25, 2000

(30) Foreign Application Priority Data

Apr. 26, 1999 (JP) ............................................. 11-118530

(51) Int. Cl.⁷ ........................ H01L 31/06; H01L 27/082; H01L 27/102; H01L 29/70; H01L 31/11
(52) U.S. Cl. ........................ 257/463; 257/461; 257/577
(58) Field of Search .................. 257/446, 461, 257/463, 577

(56) References Cited

U.S. PATENT DOCUMENTS 5,770,872 A * 6/1998 Arai ........................... 257/257
6,049,118 A * 4/2000 Nagano ...................... 257/462
6,114,740 A * 9/2000 Takimoto et al. ........... 257/461

* cited by examiner

*Primary Examiner*—Ngân V. Ngô
(74) *Attorney, Agent, or Firm*—Sonnenschein, Nath & Rosenthal

(57) ABSTRACT

A semiconductor device in which a photoreceptor element and a semiconductor element are formed on a common semiconductor substrate, includes: a substrate of a first conductive type; and a semiconductor layer of a second conductive type formed on the substrate; wherein the photoreceptor element is composed of the substrate and the semiconductor layer; and an impurity concentration region of the first conductive type having an impurity concentration higher than that of the substrate is provided at a position under the semiconductor layer in a region where the semiconductor element is to be formed.

20 Claims, 7 Drawing Sheets

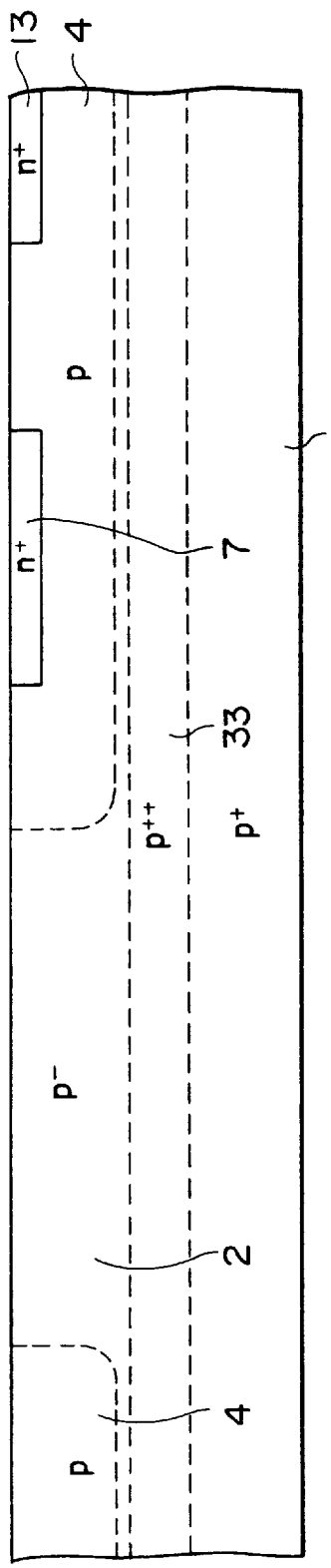
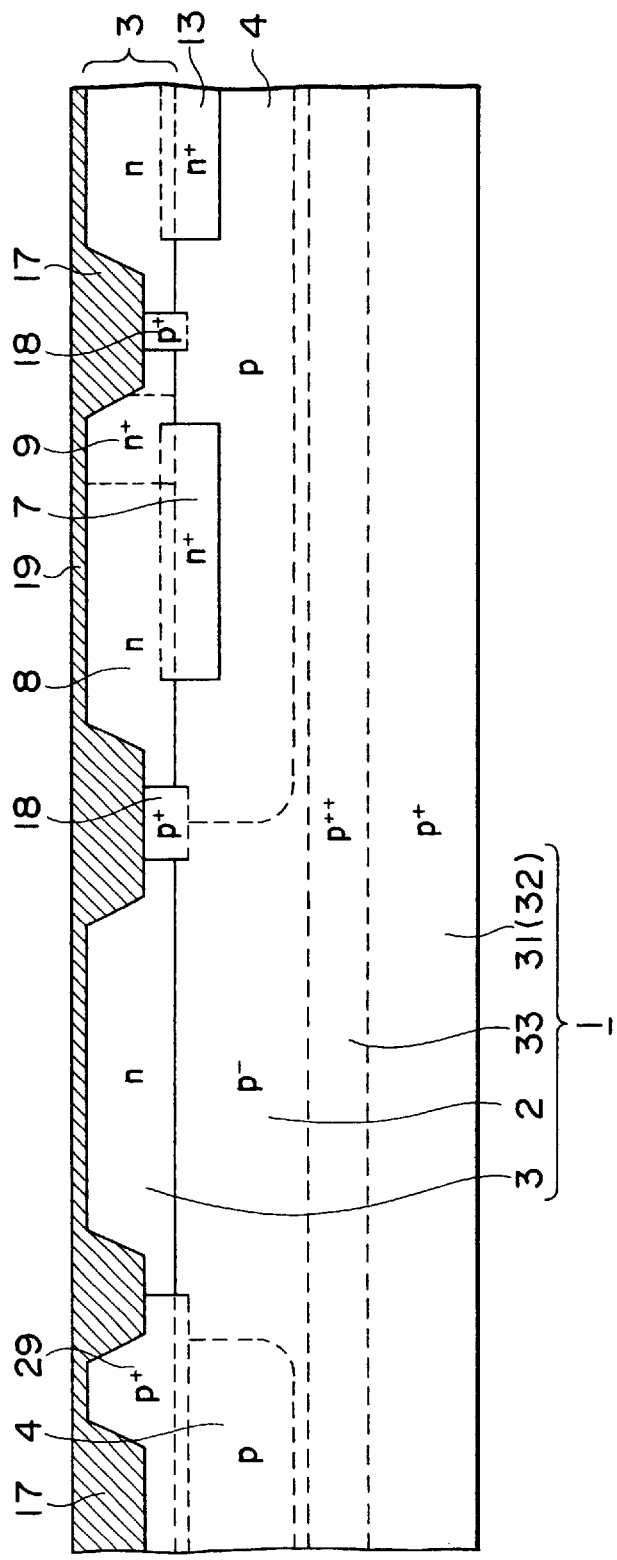

SEMICONDUCTOR DEVICE

BACKGROUND OF THE INVENTION

The present invention relates to a semiconductor device, and particularly to a semiconductor device having a photoreceptor element and another circuit element on a common semiconductor base substrate, and a fabrication method thereof.

A photodiode representative of a photoreceptor element is widely used as an optical sensor for converting an optical signal into an electric signal, concretely, as an optical sensor for control in various kinds of photoelectric conversion equipment. Along with a requirement toward higher function and miniaturization, such a photodiode becomes widely available as a circuit-integrated photoreceptor element or an IC having a photoreceptor element, that is, a photodiode IC in which the photodiode is integrated with a peripheral signal processing circuit element such as a transistor, a resistor, or a capacitance.

FIG. 7 is a schematic sectional view of a related art semiconductor of this type. Referring to FIG. 7, a p-type semiconductor layer 102 having a low concentration $P^{--}$ and an n-type semiconductor layer 103 are sequentially stacked on a p-type semiconductor substrate 101, to form a so-called PIN photodiode PD as a photoreceptor element, and a functional circuit for processing an optical current from the PIN photodiode is formed on the low concentration p-type semiconductor layer 102. In the figure, an npn-type bipolar transistor Bi-Tr as a circuit element constituting part of the functional circuit is shown.

Element isolation regions 104 for isolating elements from each other are formed in the low concentration n-type semiconductor layer 103 by ion implantation from the surface of the low concentration p-type semiconductor layer 103, followed by thermal diffusion treatment.

The photodiode IC in which the PIN photodiode PD and the functional circuit for processing an optical current from the PIN photodiode PD are assembled in the same semiconductor base substrate 100, however, has the following problems. Since each element isolation region 104 is formed by ion implantation and diffusion from the surface side as described above, the impurity concentration becomes lower on the bottom side of the element isolation region 104. As a result, the amplification ratio of npn-type parasitic transistors formed with the p-type element isolation region 104 put therebetween becomes larger, so that the effect of the parasitic transistors becomes large. Also, when a voltage is applied to an n-type region of the n-type semiconductor layer 103, a depletion layer due to the pn-junction between the n-type semiconductor layer 103 and the p-type low concentration semiconductor layer 102 extends under the element isolation region 104, to cause the punchthrough, thereby obstructing the isolation function. Further, in the case where one electrode of the photodiode PD is extracted from the isolation region 104, the parasitic resistance becomes large, to cause an inconvenience in degrading the frequency characteristic, thereby varying a current flowing in the functional circuit configured by the combination of functional elements including such a transistor and inducing oscillation, malfunction, and variations in output of these elements and circuits.

To solve such problems, there has been adopted a structure in which a p-type element isolation region is formed between a photodiode and another element in such a manner as to extend from the surface of an n-type semiconductor layer to a low concentration p-type semiconductor layer in order to isolate the n-type semiconductor layer; the concentration of the p-type element isolation region is made relatively higher; the depth of the p-type element isolation region is set to somewhat extend in the low concentration p-type semiconductor layer; and the width and the impurity concentration of the element isolation region are made relatively large. With this configuration, it is possible to suppress the above-described action of the parasitic components between the elements including the photodiode PD and the functional circuit.

For example, Japanese Patent Laid-open No. Hei 1-205564 discloses a structure shown by a schematic sectional view of FIG. 8. The structure is intended to increase a resistance against the action of the parasitic components between respective elements by forming an element isolation region 104s connected to each element isolation 104 in the low concentration semiconductor layer 102, that is, forming the element isolation regions in two stages.

In FIG. 8, parts corresponding to those shown in FIG. 7 are designated by the same characters and the overlapped explanation thereof is omitted.

In FIGS. 7 and 8, reference numeral 105 designates an n-type high impurity concentration region formed on the surface of the n-type semiconductor layer 103 of the photodiode PD; 106 is a high concentration n-type collector buried region of a transistor Bi-Tr; 107 is a collector region; 108 is a p-type base region; and 109 is an n-type emitter region.

An insulating layer 110 is formed on the surface of the semiconductor base substrate 100, and contact windows are formed over the element isolation region 104, the high concentration region 105 of the photodiode PD, the base region 108 of the bipolar transistor Bi-Tr, and the emitter region 109. Electrodes 111, 112 and 113 are brought into ohmic-contact with the element isolation region 104, the high concentration region 105 of the photodiode PD, the base region 108 of the bipolar transistor Bi-Tr, and the emitter region 109 through the contact windows, respectively.

Even in the above configuration, at the functional circuit portion, since the resistance of the substrate is increased, a certain potential occurs at a position apart from the ground extraction (grounding) electrode portion on the substrate 101 side by a certain distance, which may induce a problem such as latchup.

Further, in the case of isolating the elements from each other by provision of the element isolation layers in two stages, it is required to provide a sufficient alignment tolerance between the isolation layers. In other words, it is required to give a certain width for the element isolation layers. This gives a limitation to design rule of the circuit, and changes the area of the circuit itself.

Additionally, since the element isolation regions are disposed in the vicinities of the elements, in the case of forming the high concentration element isolation region by ion implantation, crystal defects caused by implantation of ions at a high concentration may exert adverse effect on the element characteristics.

SUMMARY OF THE INVENTION

An object of the present invention is to solve the above-described problems, and to provide a semiconductor device, particularly, an IC having a photoreceptor element capable of preventing mutual interference between functional circuits and a malfunction due to latchup.

According to the present invention, there is provided a semiconductor device in which a photoreceptor element and at least one semiconductor element other than the photoreceptor element are formed on a common semiconductor base substrate, characterized in that the semiconductor base substrate has a low impurity concentration semiconductor layer of a first conductive type; a high impurity concentration region of the first conductive type having an impurity concentration higher than that of the low impurity concentration semiconductor layer is formed in the low impurity concentration semiconductor layer at a forming portion of the semiconductor element; and the photoreceptor element comprises a low impurity concentration region, other than the high impurity concentration region at the forming portion of the semiconductor element, of the low impurity concentration semiconductor layer, and a second conductive type region formed on the low impurity concentration region.

According to the present invention, there is also provided a method of fabricating a semiconductor device in which a photoreceptor element and at least one semiconductor element other than the photoreceptor element are formed on a common semiconductor base substrate, including the steps of: forming a high impurity concentration region in a low impurity concentration semiconductor layer of a first conductive type at a position other than a forming portion of a photo-reception region of the photoreceptor element; and forming a low impurity concentration semiconductor layer of a second conductive type at least in the forming portion of the photoreceptor element.

With this configuration, the high impurity concentration region is formed in the low impurity concentration semiconductor layer of the first conductive type constituting part of the photoreceptor element at the forming portion of another semiconductor element. As a result, with respect to the photoreceptor element, since the junction is formed between the low impurity concentration semiconductor layer and the same, the width of a depletion layer is enlarged to reduce the junction capacitance, thereby realizing a desirable photo-reception sensitivity and a desirable high frequency characteristic. With respect to another semiconductor element, since the high impurity concentration region is formed at the forming portion of the semiconductor element, it is possible to reduce the resistance of the substrate, and hence to suppress the occurrence of latchup. Further, according to the present invention, the isolation between elements is reinforced.

BRIEF DESCRIPTION OF THE DRAWINGS

FIGS. 6A and 6B are schematic sectional views each showing a fragmental structure of the semiconductor device of the present invention at one fabrication step;

DETAILED DESCRIPTION OF THE PREFERRED EMBODIMENTS

Hereinafter, one embodiment of a semiconductor device of the present invention will be described with reference to a schematic sectional view of FIG. 1. The description of the embodiment is for illustrative purposes only, and it is to be understood that the present invention is not limited thereto.

In this embodiment, a photodiode IC including a photodiode PD as a photoreceptor element and another semiconductor element constituting a functional circuit for processing an optical current from the photodiode PD is provided on a common semiconductor base substrate 1.

Figure 1:
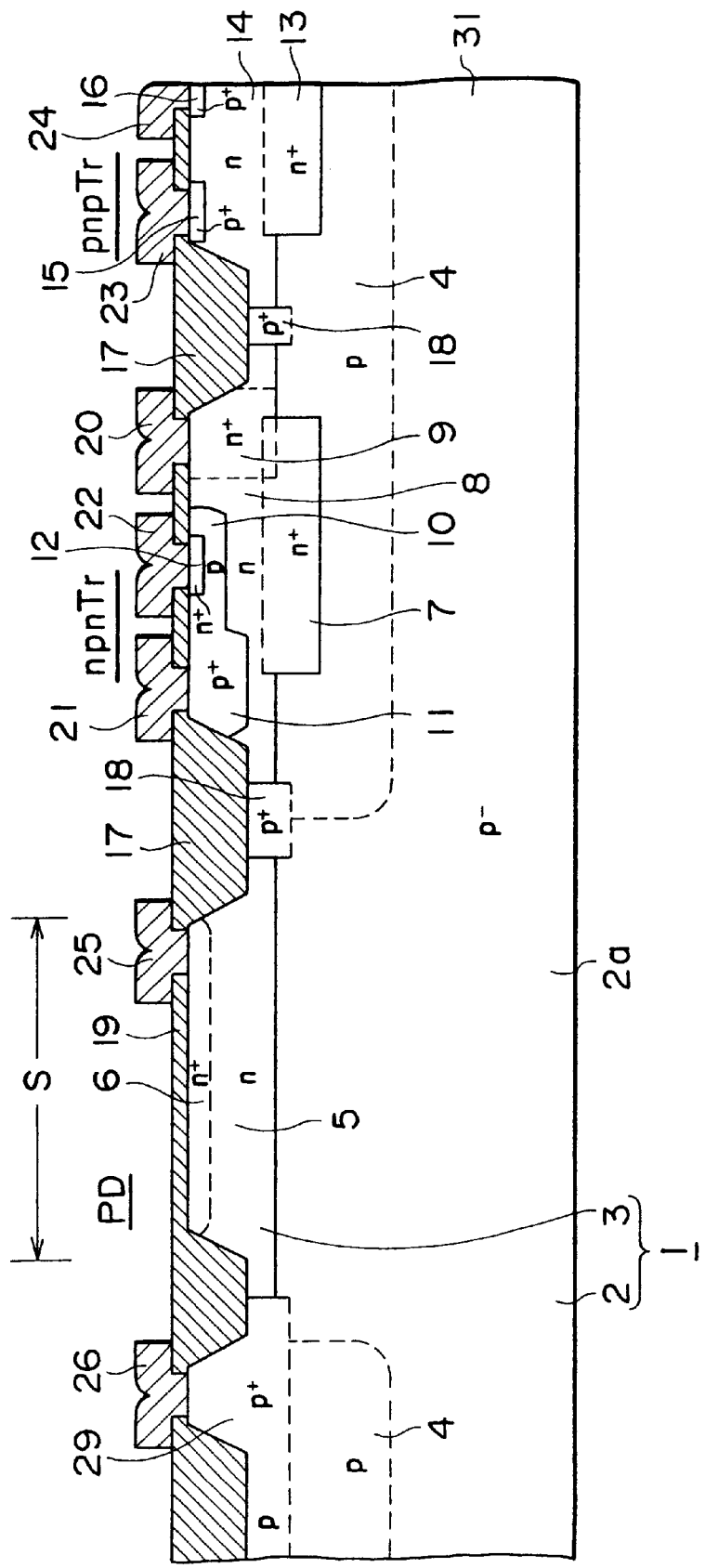
FIG. 1 is a schematic sectional view of one example of a semiconductor device of the present invention.

Referring to FIG. 1, a photodiode PD and another semiconductor element composed of an npn-type transistor npnTr and a pnp-type transistor pnpTr having a so-called lateral configuration are formed.

In the embodiment shown in FIG. 1, a semiconductor base substrate 1 is composed of a low impurity concentration semiconductor layer 2 of a first conductive type (p-type in this embodiment) which is formed by a semiconductor substrate 31 and which has a surface concentration of $5 \times 10^{13}$ to $5 \times 10^{14}$ atoms/cm$^3$, and a semiconductor layer 3 of a second conductor type (n-type in this embodiment) having a surface concentration of $1 \times 10^{15}$ to $1 \times 10^{16}$ atoms/cm$^3$.

A high impurity concentration region 4 of the first conductive type (p-type in this embodiment) having an impurity concentration higher than that of the low impurity concentration semiconductor layer 2, typically, having a surface concentration of $1 \times 10^{15}$ to $5 \times 10^{15}$ atoms/cm$^3$ is formed in the low impurity concentration semiconductor layer 2 of the first conductive type over the entire region other than a forming portion of a photodiode PD.

The remaining region, in which the high impurity concentration region 4 is not formed, of the low impurity concentration semiconductor layer 2 constitutes a low impurity concentration region 2a of the first conductive type (p-type in this embodiment) for forming a photo-reception region S of the photodiode PD.

In the forming portion of the photodiode PD, a region 5 of the other conductive type, that is, the second conductive type (n-type in this embodiment) for forming the photodiode PD is formed by part of the second conductive type semiconductor layer 3 in such a manner as to be in contact with the low impurity concentration region 2a.

A low resistance region 6 of the second conductive type (n-type in this embodiment) having a high impurity concentration is formed in the second conductive type region 5 in such a manner as to face to the surface of the semiconductor base substrate 1.

In this way, according to the embodiment shown in FIG. 1, the photodiode PD having the low impurity concentration region 2a as an anode and the second conductive type region 5 as a cathode is formed.

On the other hand, an npn-type transistor npnTr is formed over the high impurity concentration region 4.

In the embodiment shown in FIG. 1, a buried region 7 of the second conductive type (n-type in this embodiment) having a high concentration, that is, a collector buried region 7 is formed, and a collector region 8 is formed by part of the semiconductor layer 3 positioned on the collector buried region 7 and having the same conductive type as that of the collector buried region 7, that is, having the second conductive type. A collector electrode extraction region 9 of the second conductive type (n-type in this embodiment) having a high concentration is formed in part of the collector region 8 in such a manner as to have a depth reaching the buried region 7 having the high concentration.

A base region 10 of the first conductive type (p-type) is formed on the collector region 8. A base electrode extraction region 11, that is, a graft base region 11 of the first conductive type (p-type) having a high concentration is formed in part of the base region 10. An emitter region 12 having the second conductive type (n-type) is formed in a portion, in which the base region 11 is not formed, of the base region 10, that is, in the intrinsic base region.

In this way, a vertical transistor, that is, an npn-type bipolar transistor npnTr including the collector region 8, base region 10, and emitter region 12 is formed.

A forming portion of a pnp-type transistor pnpTr is also formed over the high impurity concentration region 4. In this case, a base buried region 13 of the second conductive type (n-type in this embodiment) is formed on the high impurity concentration region 4.

A base region 14 is formed by part of the second conductive type semiconductor layer 3 positioned on the base buried region 13. A collector region 15 and an emitter region 16, each of which is of the first conductive type (p-type in this embodiment), are formed in the base region 14 in such a manner as to be spaced with a specific gap put therebetween and to face to the surface of the semiconductor base substrate 1.

While not shown, a base electrode extraction region of the second conductive type having a high concentration can be formed in such a manner as to extend from the surface of the base region 14 to the base buried region 13.

In this way, a lateral type transistor, that is, a pnp type bipolar transistor pnpTr including the emitter region 16, base region 14, and collector region 15 is formed.

Thick element isolation insulating layers 17 are formed in the semiconductor base substrate 1 at positions between respective elements such as a the photodiode and transistors. An element isolation region 18 composed of the first conductive type high concentration region is formed at a position under each of the isolation insulating layer 17 in such a manner as to have a depth being in contact with the high impurity concentration region 4.

In this way, according to the embodiment shown in FIG. 1, isolation between the elements is performed by provision of the element isolation regions 18 and the element isolation insulating layers 17.

A surface insulating layer 19 is formed over the entire surface of the semiconductor base substrate 21 excluding the areas in which the element isolation insulating layers 17 are formed. Contact windows are opened at specific portions of the surface insulating layer 19.

With respect to the npn-type transistor npnTr, a collector electrode 20, a base electrode 21, and an emitter electrode 22 are deposited on the collector electrode extraction region 9, base electrode extraction region 11, and emitter region 12 via the contact windows formed in the surface insulating layer 19 respectively in such a manner as to be in ohmic-contact therewith.

At the same time, with respect to the pnp-transistor pnpTr, a collector electrode 23 and an emitter electrode 24 are deposited on the collector region 15 and emitter region 16 respectively in such a manner as to be in ohmic-contact therewith, and a base electrode (not shown) is formed on the base electrode extraction region (not shown) in such a manner as to be in ohmic-contact therewith.

At the same time, one electrode, that is, a first electrode 25 which is configured as a cathode electrode in this embodiment is deposited on the low resistance region 6 of the photodiode PD via the contact window formed in the surface insulating layer 19 in such a manner as to be in ohmic-contact therewith.

The other electrode, that is, a second electrode 26 of the photodiode PD, which is configured as an anode electrode in this embodiment, is led as follows: namely, a high impurity concentration region 4 is formed under the leading portion; and an electrode extraction region 29 having a high impurity concentration is formed along with formation of element isolation regions 18 and/or a base electrode extraction region 11 at a depth reaching the region 4; and the second electrode 26 is deposited on the region 29 in such a manner as to be in ohmic-contact therewith.

The semiconductor device of the present invention, that is, the photodiode IC having the above configuration has the following features. With respect to the photodiode, since the width of a depletion layer formed by the second conductive type region 5 and the low impurity concentration region $2a$ of the first conductive type is wide and the junction capacitance is low, there can be obtained a photodiode having a high sensitivity and an adaptability to a high frequency. With respect to the formation portion of another semiconductor element, since the high impurity concentration region 4 is formed, there can be obtained a bipolar transistor circuit less affected by the action of the parasitic components, punchthrough, latchup, and the like due to the element isolation regions. As a result, according to this embodiment, there can be obtained a high performance photodiode IC.

Figure 8:
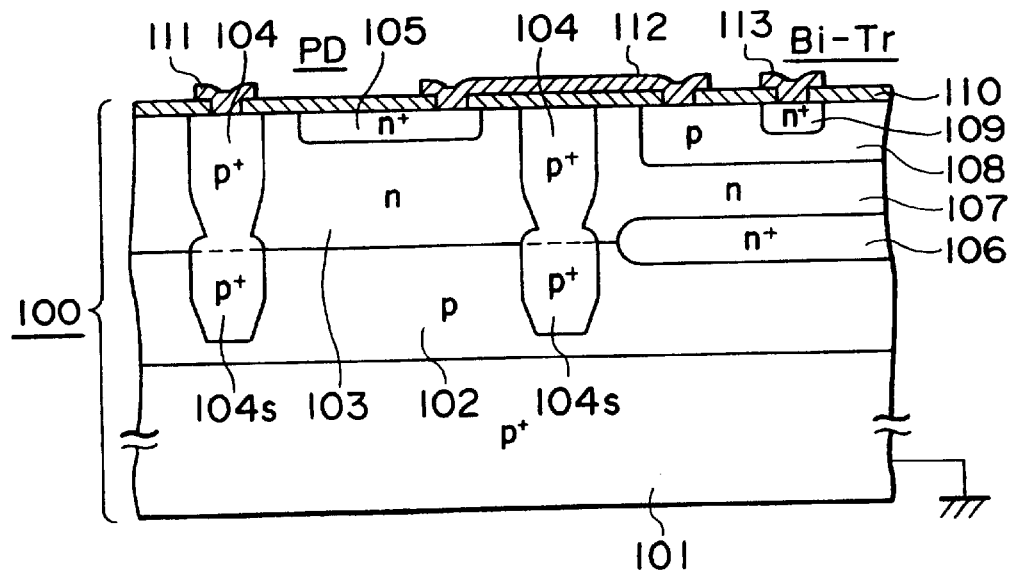
FIG. 8 is a schematic sectional view of another related art semiconductor device.

According to the semiconductor device of the present invention, it is possible to avoid the configuration shown in FIG. 8 in which the two element isolation insulating layers are stacked, and hence to simplify the fabrication process and reduce the layout area.

Figure 2:
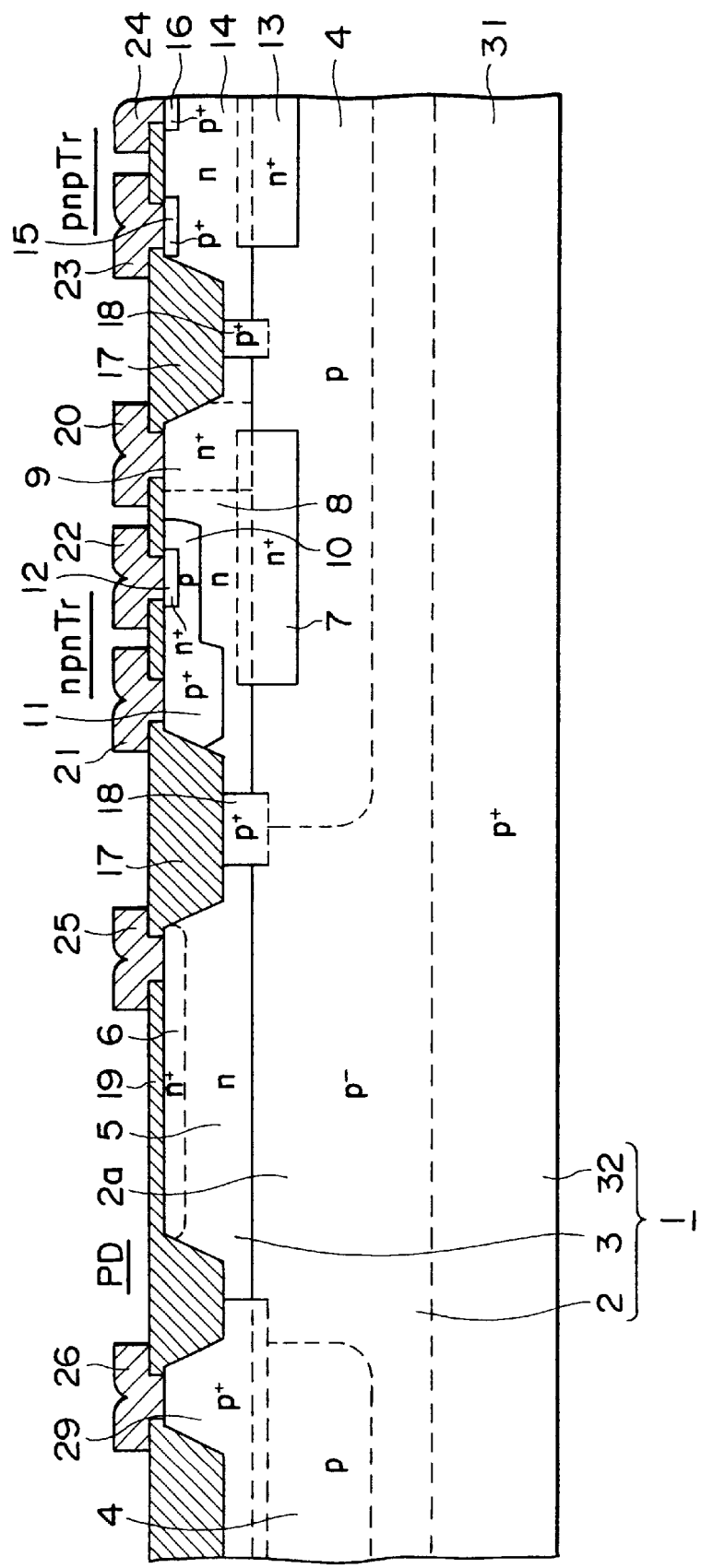
FIG. 2 is a schematic sectional view of another example of the semiconductor device of the present invention.
Figure 3:
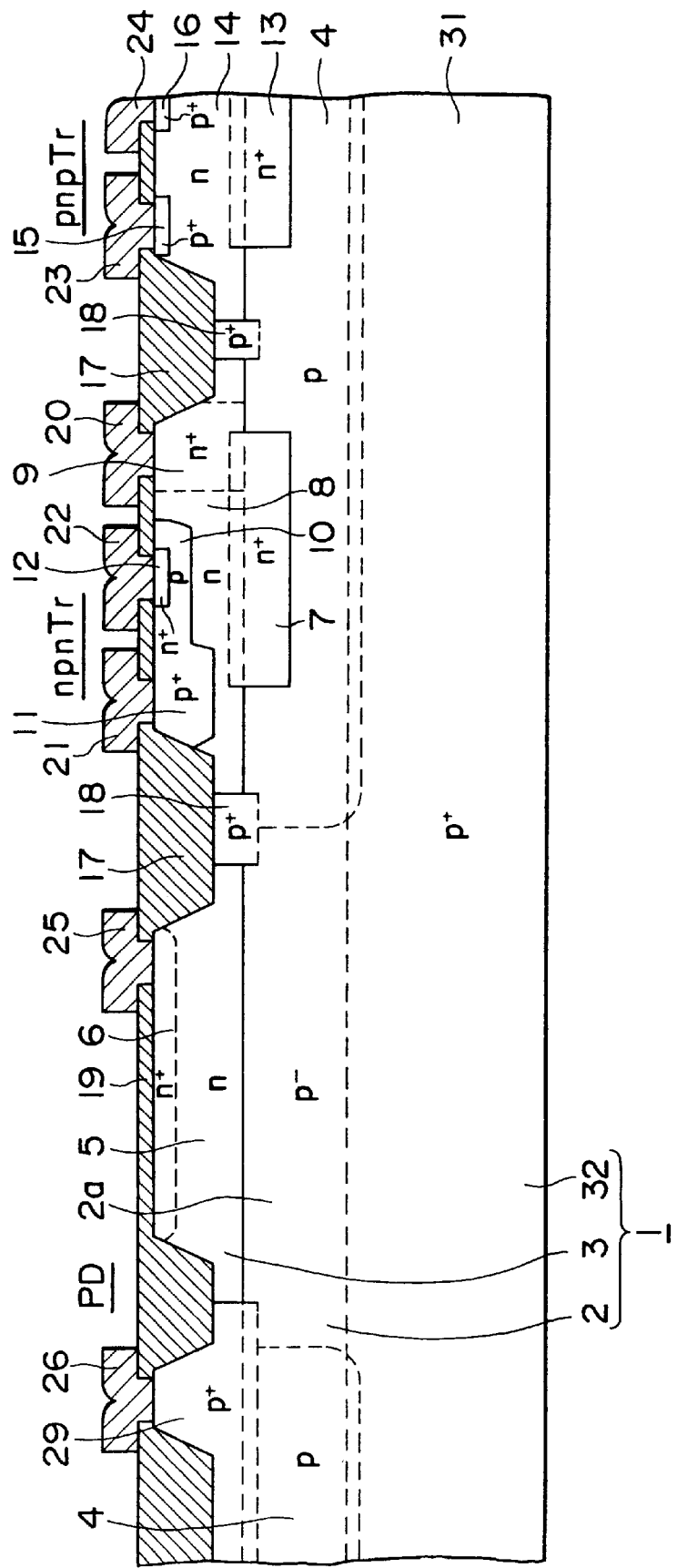
FIG. 3 is a schematic sectional view of a further example of the semiconductor device of the present invention.

In the above embodiment, the semiconductor base substrate 1 has a stacked structure having the first conductive type low impurity concentration semiconductor layer 2 constituting the low impurity concentration region $2a$ and the second conductive type semiconductor layer 3; however, as shown by schematic cross-sectional views of FIGS. 2 and 3, the semiconductor base substrate 1 may be configured by a semiconductor substrate 31 constituting a first conductive type high concentration semiconductor layer 32 having a surface concentration of $1\times10^{15}$ to $5\times10^{16}$ atoms/cm$^3$, and a first conductive type low impurity concentration semiconductor layer 2 having a thickness of 5 to 20 $\mu$m and having a surface concentration of at least $5\times10^{13}$ to $5\times10^{14}$ atoms/cm$^3$ and a second conductive type semiconductor layer 3 stacked on the semiconductor substrate 31.

In this case, the depth of a high impurity concentration region 4 is selected, as shown in FIG. 2, at a value not reaching a first conductive type high concentration semiconductor layer 32, or selected, as shown in FIG. 3, at a value reaching the first conductive type high concentration semiconductor layer 32.

It is to be noted that in FIGS. 2 and 3, parts corresponding to those shown in FIG. 1 are designated by the same characters and the overlapped explanation thereof is omitted.

According to the embodiment shown in FIGS. 2 and 3 in which the first conductive type high concentration semiconductor layer 32 is provided, the resistance of the substrate can be reduced. Accordingly, it is possible to reduce the parasitic resistance of the photodiode PD and hence to improve the frequency characteristic, and to improve the resistance against latchup by reducing the resistance of the substrate over the circuit.

Figure 4:
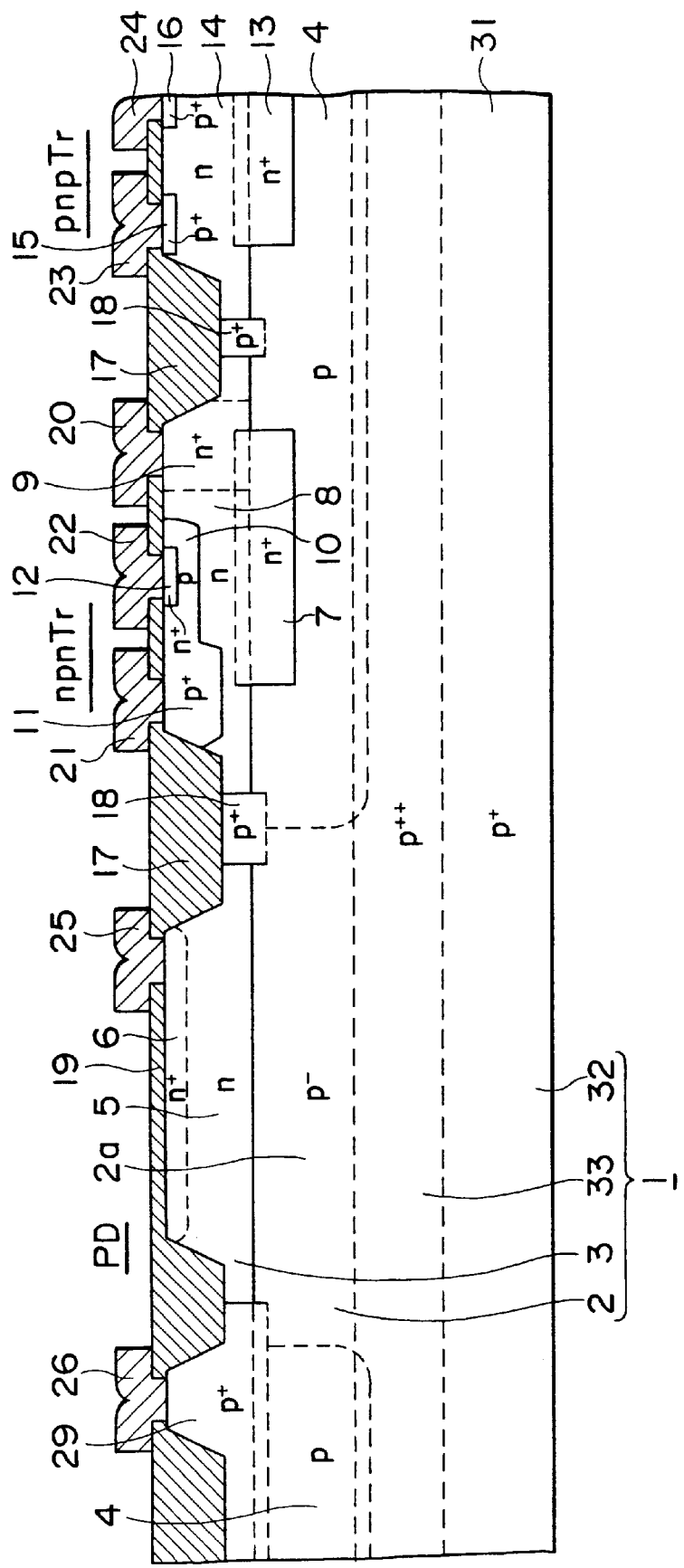
FIG. 4 is a schematic sectional view of a further example of the semiconductor device of the present invention.
Figure 5:
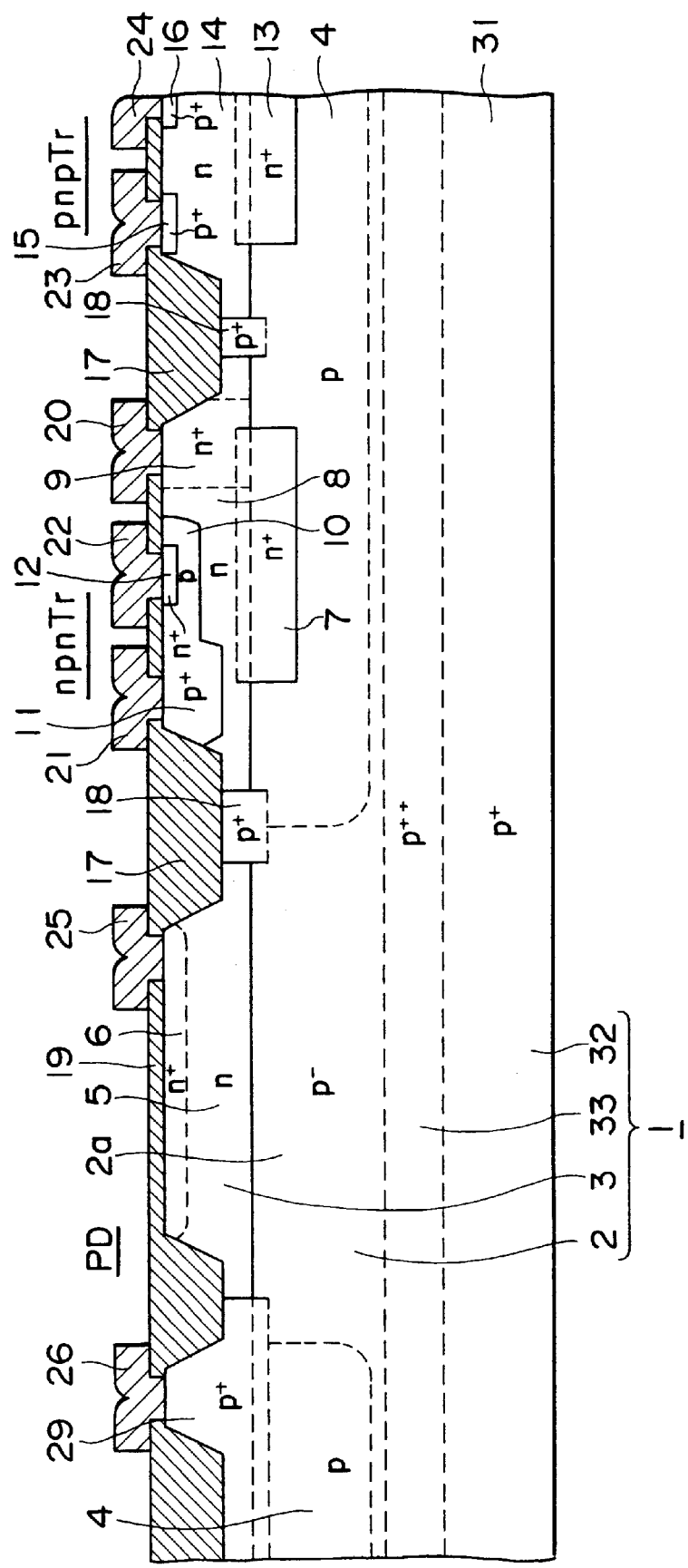
FIG. 5 is a schematic sectional view of a further example of the semiconductor device of the present invention.
Figure 7:
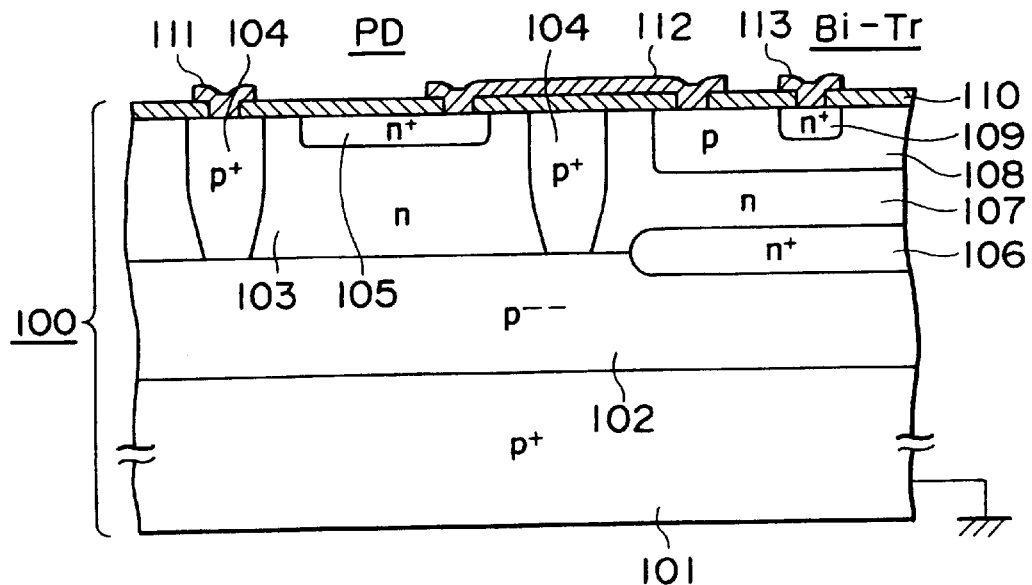
FIG. 7 is a schematic sectional view of a related art semiconductor device.

The semiconductor base substrate 1 may be configured, as shown by schematic cross-sectional views of FIGS. 4 and 5, by interposing an intermediate semiconductor layer 33 of the first conductive type, which has an impurity concentration higher than that of a high impurity concentration semiconductor layer 32, concretely, has a surface concentration of $5 \times 10^{17}$ to $5 \times 10^{18}$ atoms/cm$^3$, between the high impurity concentration semiconductor layer 32 and a low impurity concentration semiconductor layer 2.

In FIGS. 4 and 5, parts corresponding to those shown in FIGS. 1 to 3 are designated by the same characters and the overlapped explanation is omitted.

In the example shown in FIG. 4, a high impurity concentration region 4 has a depth reaching the intermediate semiconductor layer 33, while in the example shown in FIG. 5, the high impurity concentration region 4 has a depth not reaching the intermediate semiconductor layer 33.

According to the embodiment shown in FIGS. 4 and 5 in which the high concentration intermediate semiconductor layer 33 is provided, the resistance of the substrate can be further reduced. Accordingly, it is possible to reduce the parasitic resistance of the photodiode PD and hence to improve the frequency characteristic, and to improve the resistance against latchup by reducing the resistance of the substrate over the circuit.

Next, a method of fabricating the semiconductor device according to the present invention will be described.

The fabrication method has a step of forming a high impurity concentration region at least in a first conductive type low impurity concentration semiconductor layer at a position excluding a forming portion of a photodiode PD, and a step of forming a second conductive type low impurity concentration semiconductor layer at least in the forming portion of the photodiode PD.

One embodiment of the fabrication method of the present invention will be described with reference to FIGS. 6A and 6B. In addition, the description of the embodiment is for illustrative purposes only, and it is to be understood that the fabrication method of the present invention is not limited thereto.

Hereinafter, the method of fabricating the semiconductor device having the configuration shown in FIG. 5 will be described.

Referring to FIG. 6A, a first conductive type high impurity concentration semiconductor layer 32 composed of a silicon semiconductor substrate 31, an intermediate semiconductor layer 33, and a low impurity concentration semiconductor layer 2 are formed; a high impurity concentration region 4 is formed over the entire region excluding a forming portion of a photodiode PD in such a manner as to face to the surface of the low impurity concentration semiconductor layer 2; and a collector buried region 7 is formed in the high impurity concentration region 4 at a forming portion of an npn-type transistor and a base buried region 13 is formed in a forming portion of a pnp-type transistor by ion implantation and/or thermal diffusion treatment.

To be more specific, the silicon semiconductor substrate 31 constituting the first conductive type (for example, p-type) high impurity concentration semiconductor layer 32 is prepared. A thin oxide film is formed on one principal plane of the substrate 31 by thermal oxidation. Then, ions of boron (B) as the impurity of the first conductive type (p-type) are implanted through the oxide film at 30 keV in a dose of $1 \times 10^{15}$/cm$^2$, followed by diffusion of the implanted impurity by thermal diffusion treatment performed at 1200° C. for one hour, to form the intermediate semiconductor layer 33 having a peak concentration of about $1 \times 10^{18}$ atoms/cm$^3$.

The oxide film is removed, and the low impurity concentration semiconductor layer 2 is formed on the intermediate semiconductor layer 33. To be more specific, a silicon semiconductor layer having the concentration of a p-type impurity of about $2 \times 10^{14}$ atoms/cm$^3$ is epitaxially grown to a thickness of about 10 μm by a CVD (Chemical Vapor Deposition) process, to form the low impurity concentration semiconductor layer 2.

A thin oxide film is formed on the surface of the low impurity concentration semiconductor layer 2. Then, ions of boron (B) as the impurity having the first conductive type are implanted over the entire region excluding the forming portion of the photodiode PD through the oxide film at 500 keV in a dose of $1 \times 10^2$/cm$^2$, followed by thermal diffusion treatment performed at a temperature ranging from 1000° C. to 1250° C. for a time ranging from 30 min to 120 min, typically, at 1200° C. for one hour, to form the high impurity concentration region 4 having a surface concentration ranging from $1 \times 10^{15}$ to $5 \times 10^{15}$ atoms/cm$^3$, typically, $2 \times 10^{15}$ atoms/cm$^3$.

Then, Sb as the impurity having the second conductive type (n-type) is vapor-diffused in the high impurity concentration region 4 at forming portions of the buried regions 7 and 13 by using an impurity source of Sb$_2$O$_3$, followed by thermal diffusion treatment performed at a temperature ranging from 1100° C. to 1200° C. for a time ranging from 30 min to 60 min, to form the buried regions 7 and 13.

In addition, the heat treatment upon formation of the high impurity concentration region 4 can be performed simultaneously with the heat treatment upon formation of the buried regions 7 and 13.

Next, as shown in FIG. 6B, a second conductive type (n-type) semiconductor layer 3 is formed on the low impurity concentration semiconductor layer 2. To be more specific, a silicon semiconductor layer having an impurity concentration of $5 \times 10^{15}$ atoms/cm$^3$ is epitaxially grown to a thickness of 1 μm by the CVD process, to form the second conductive type semiconductor layer 3. In this way, a semiconductor base substrate 1 having the semiconductor layers 32, 33, 2 and 3 is formed.

A mask made from SiN is formed on the surface of the second conductive type semiconductor layer 3 at element forming portions by thermal oxidation via a pad layer made from SiO$_2$, and element isolation insulating layers 17 are formed at positions between respective elements by a known LOCOS (Local Oxidation of Silicon) technique.

The mask formed by thermal oxidation is removed, and surface insulating layers 19 each having a specific thickness are formed, by thermal oxidation, on the portions from which the mask is removed.

Ions of boron (B) are implanted in a dose of $10^{13}$/cm$^2$, to form element isolation regions 18 each having a surface concentration of $10^{18}$ atoms/cm$^3$ under the element isolation insulating layers 17 disposed at the positions between the elements.

In this way, according to this embodiment, isolation between the elements is performed by provision of the element isolation regions 18 and the element isolation insulating layers 17.

A collector electrode extraction region 9 by the second conductive type (n-type) high concentration region is formed in part of the second conductive type semiconductor layer 3 positioned on the buried layer 7 by ion implantation.

Next, as shown in FIG. 5, a photodiode PD, a vertical npn-type transistor npnTr, and a lateral pnp-type transistor pnpTr are formed in accordance with the usual method of forming a photodiode, a vertical npn-type transistor, and a lateral pnp-type transistor.

A base region 10 of the first conductive type (p-type) is formed in the collector region 8. A base electrode extraction region 11 of the first conductive type (p-type) having a high concentration, that is, graft base region 11 is formed in part of the base region 10, and an emitter region 12 of the second conductive type (n-type) is formed in a portion of the base region 10 in which the region 11 is not formed, that is, in the intrinsic base region.

In this way, a vertical transistor, that is, an npn-type bipolar transistor npnTr including the collector region 8, base region 10, and emitter region 12 is formed.

A pnp-type transistor pnpTr is also formed over the high impurity concentration region 4. In this case, a base buried region 13 of the second conductive type (n-type) is formed on the high impurity concentration region 4.

A base region 14 is formed by part of the second conductive type semiconductor layer 3 positioned on the base buried region 13. A collector region 15 and an emitter region 16, each of which is of the first conductive type (p-type), are formed in the base region 14 in such a manner as to be spaced with a specific gap put therebetween and to face to the surface of the semiconductor base substrate 1.

While not shown, a base electrode extraction region of the second conductive type having a high concentration can be formed on the base buried region 13.

In this way, a lateral type transistor, that is, a pnp type bipolar transistor pnpTr including the emitter region 16, base region 14, and collector region 15 is formed.

With respect to the npn-type transistor npnTr, a collector electrode 20, a base electrode 21, and an emitter electrode 22 are deposited on the collector electrode extraction region 9, base electrode extraction region 11, and emitter region 12 via the contact windows formed in the surface insulating layer 19 respectively in such a manner as to be in ohmic-contact therewith.

At the same time, with respect to the pnp-transistor pnpTr, a collector electrode 23 and an emitter electrode 24 are deposited on the collector region 15 and emitter region 16 respectively in such a manner as to be in ohmic-contact therewith, and while not shown, a base electrode is formed on the base electrode extraction region in such a manner as to be in ohmic-contact therewith.

At the same time, one electrode, that is, a first electrode 25 which is configured as a cathode electrode in this embodiment is deposited on the low resistance region 6 of the photodiode PD via the contact window formed in the surface insulating layer 19 in such a manner as to be in ohmic-contact therewith.

The other electrode, that is, a second electrode 26 of the photodiode PD, which is configured as an anode electrode in this embodiment, is led as follows: namely, a high impurity concentration region 4 is formed under the leading portion; and an electrode extraction region 29 having a high impurity concentration is formed along with formation of element isolation regions 18 and/or a base electrode extraction region 11 at a depth reaching the region 4; and the second electrode 26 is deposited on the region 29 in such a manner as to be in ohmic-contact therewith.

The above-described ion implantation may be performed by preparing an ion implantation mask formed of a photoresist layer, forming the mask into a specific pattern by photolithography, and implanting ions of each impurity in a selected region.

According to the above-described fabrication method of the present invention, the semiconductor device of the present invention, for example, the semiconductor device shown in FIG. 5 can be fabricated.

According to the fabrication method of the present invention, it is possible to eliminate the need of formation of the element isolation insulating layers in two stages shown in FIG. 8.

In the above-described embodiments, the first conductive type is taken as the p-type and the second conductive type is taken as the n-type; however, the first conductive type may be taken as the n-type and the second conductive type may be taken as the p-type.

In the above-described embodiments, another semiconductor element is taken as the npn-type bipolar transistor and pnp-type lateral bipolar transistor; however, the present invention can be applied to a semiconductor device in which other circuit elements, semiconductor elements, or element constituting circuits containing them are formed and to a fabrication method thereof.

As described above, the semiconductor device of the present invention has the following effects. With respect to the photodiode, since the width of a depletion layer formed by the second conductive type region 5 and the low impurity concentration region 2a of the first conductive type is wide and the junction capacitance is low, there can be obtained a photodiode having a high sensitivity and an adaptability to a high frequency. With respect to the formation portion of the semiconductor element, since the high impurity concentration region 4 is formed, there can be obtained a bipolar transistor circuit less affected by the action of the parasitic components, punchthrough, latchup, and the like due to the element isolation regions. As a result, there can be obtained a high performance photodiode IC.

According to the fabrication method of the present invention, the above-described semiconductor device of the present invention can be fabricated without formation of the element isolation regions in two stages shown in FIG. 8. Accordingly, it is possible to simplify the fabrication process, and hence to improve the fabrication yield, and also to avoid the increase in area due to the broaden tolerance for alignment between the element isolation regions in two stages and hence to obtain an IC having a high density photoreceptor element.

While the preferred embodiments have been described using specific terms, such description is for illustrative purposes only, and it is to be understood that changes and variations may be made without departing from the sprit or scope of the following claims.

What is claimed is:

1. A semiconductor device in which a photoreceptor element and a semiconductor element are formed on a common semiconductor substrate, comprising:

a substrate of a first conductive type; and a semiconductor layer of a second conductive type formed on said substrate;

wherein said photoreceptor element is comprised of said substrate and said semiconductor layer; and an impurity concentration region of the first conductive type having an impurity concentration higher than that of said substrate is provided at a position under said semiconductor layer in a region where said semiconductor element is to be formed.

2. A semiconductor device according to claim 1, wherein an element isolation insulating layer is formed between said photoreceptor element and said semiconductor element.

3. A semiconductor device according to claim 2, wherein an element isolation region of the first conductive type connected to said impurity concentration region is formed under said element isolation insulating layer.

4. A semiconductor device according to claim 1, wherein said impurity concentration region surrounds said semiconductor element.

5. A semiconductor device according to claim 1, wherein said substrate has a second impurity concentration region of the first conductive type having an impurity concentration higher than that of said substrate, said second impurity concentration region being positioned in a lower portion of said substrate.

6. A semiconductor device according to claim 5, wherein said impurity concentration region is connected to said second impurity concentration region.

7. A semiconductor device according to claim 5, wherein said substrate has a third impurity concentration region having an impurity concentration higher than that of each of said substrate and said second impurity concentration region, said third impurity concentration region being positioned between said substrate and said second impurity concentration region.

8. A semiconductor device according to claim 7, said impurity concentration region is connected to said third impurity concentration region.

9. A semiconductor device according to claim 1, wherein a low resistance region of the second conductive type having an impurity concentration higher than that of said semiconductor layer is formed on the surface of said semiconductor layer constituting part of said photoreceptor.

10. A semiconductor device according to claim 1, wherein an electrode extraction region is provided in such a manner as to be connected to said substrate constituting parts of said photoreceptor element.

11. A semiconductor device according to claim 10, wherein said substrate has a second impurity concentration region of the first conductive type having an impurity concentration higher than that of said substrate, said second impurity concentration region being positioned in a lower portion of said substrate, and said electrode extraction region is connected to said second impurity concentration region.

12. A semiconductor device according to claim 10, wherein said substrate has a second impurity concentration region of the first conductive type having an impurity concentration higher than that of said substrate, said second impurity concentration region being positioned in a lower portion of said substrate, and has a third impurity concentration region having an impurity concentration higher than that of each of said substrate and said second impurity concentration region, said third impurity concentration being positioned between said substrate and said second impurity concentration region; and said electrode extraction region is connected to said third impurity concentration.

13. A semiconductor device in which a photoreceptor element and a bipolar transistor are formed on a common semiconductor substrate, comprising:

a substrate of a first conductive type; and a semiconductor layer of a second conductive type formed on said substrate;

wherein said photoreceptor element is comprised of said substrate and said semiconductor layer; and an impurity concentration region of the first conductive type having an impurity concentration higher than that of said substrate is provided at a position under said semiconductor layer in a region where said bipolar transistor is to be formed.

14. A semiconductor device according to claim 13, wherein an element isolation insulating layer is formed between said photoreceptor element and said bipolar transistor, and an element isolation region of the first conductive type connected to said impurity concentration region is formed under said element isolation insulating layer.

15. A semiconductor device according to claim 13, wherein said impurity concentration region surrounds said bipolar transistor.

16. A semiconductor device according to claim 13, wherein said substrate has a second impurity concentration region of the first conductive type having an impurity concentration higher than that of said substrate, said second impurity concentration region being positioned in a lower portion of said substrate.

17. A semiconductor device according to claim 16, wherein said substrate has a third impurity concentration region having an impurity concentration higher than that of each of said substrate and said second impurity concentration region, said third impurity concentration region being positioned between said substrate and said second impurity concentration region.

18. A semiconductor device according to claim 13, wherein a low resistance region of the second conductive type having an impurity concentration higher than that of said semiconductor layer is formed on the surface of said semiconductor layer constituting part of said photoreceptor element; and said semiconductor layer in a region where said bipolar transistor is to be formed constitutes one terminal of said bipolar transistor, and the other two terminals of said bipolar transistor are formed in said semiconductor layer in the region where said bipolar transistor is to be formed.

19. A semiconductor device according to claim 18, wherein said bipolar transistor is a lateral bipolar transistor.

20. A semiconductor device according to claim 18, wherein said bipolar transistor is a vertical bipolar transistor.

* * * * *